(12) United States Patent
Okada

(10) Patent No.: US 8,013,589 B2
(45) Date of Patent: Sep. 6, 2011

(54) SEMICONDUCTOR DEVICE

(75) Inventor: Hirokazu Okada, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 298 days.

(21) Appl. No.: 12/405,735

(22) Filed: Mar. 17, 2009

(65) Prior Publication Data

US 2009/0243588 A1 Oct. 1, 2009

(30) Foreign Application Priority Data

Mar. 27, 2008 (JP) ................. 2008-084424

(51) Int. Cl.
*G01R 27/08* (2006.01)
*G01R 19/00* (2006.01)

(52) U.S. Cl. ................... 324/76.11; 324/713

(58) Field of Classification Search ........... 324/76.11, 324/713

See application file for complete search history.

(56) References Cited

U.S. PATENT DOCUMENTS 6,255,842 B1 * 7/2001 Hashimoto ............. 324/76.11
7,352,193 B2 * 4/2008 Nakahara ................. 324/713

FOREIGN PATENT DOCUMENTS

| JP | 62-245779 A | 10/1987 |
| JP | 9-98089 A | 4/1997 |
| JP | 3471256 B2 | 9/2003 |

\* cited by examiner

*Primary Examiner* — Vincent Q Nguyen
(74) *Attorney, Agent, or Firm* — Arent Fox LLP

(57) ABSTRACT

A device includes a measurement target circuit including a first circuit, a switch provided to a measurement node of the first circuit and a second circuit connected to the measurement node of the first circuit through the switch; and a current measuring circuit including a reference current source group connected to the measurement node through the switch and making a reference current of a predetermined value flow into the first circuit, a sample hold circuit connected to the measurement node, and sampling and holding the potential of the measurement node when the first circuit is connected to the second circuit by the switch, and a comparator connected to the measurement node and an output of the sample hold circuit and comparing an output of the sample hold circuit with the potential of the measurement node when the first circuit is connected to the reference current source group by the switch.

9 Claims, 11 Drawing Sheets

US 8,013,589 B2

SEMICONDUCTOR DEVICE

CROSS-REFERENCE TO RELATED APPLICATIONS

This application is based upon and claims the benefit of priority of Japanese Patent Application No. 2008-84424, filed on Mar. 27, 2008, the entire contents of which are incorporated herein by reference.

FIELD

Aspects of the embodiments of a semiconductor device described herein are directed to a semiconductor device having a current measuring circuit for measuring current flowing in a measurement target circuit.

BACKGROUND

In order to measure current flowing through a circuit in a semiconductor device (IC chip), it has been hitherto required to mount a measurement target terminal in a chip and measure the current by an external current tester. The current measurement of circuits in a chip is utilized to check defects of the circuits in an IC chip before the IC chip is manufactured and shipped, or to specify a defective circuit in an IC chip under malfunction, for example.

JP-A-62-245779 discloses a deflection circuit which compares a held voltage value with a set value and uses the difference value therebetween.

Japanese patent No. 3,471,256 discloses an A/D converter which has first and second comparators for comparing an input voltage value held in a sample hold circuit with a voltage value output from a digital/analog converter, selectively outputs a comparison result signal of the first and second comparators on the basis of a select signal output from a control circuit and settles a digital signal value in accordance with the comparison result signal supplied from a selector.

JP-A-09-98089 discloses a D/A conversion circuit having plural current sources provided to generate a reference voltage, a switch circuit for arbitrarily selecting a current source and stepwise setting a current value, an integration circuit for generating and varying a reference voltage at the speed corresponding to the set current value, and a control circuit for controlling the next connection of the switch circuit in accordance with the comparison result between the input signal and the reference voltage.

However, in order to measure current flowing through a circuit in an IC chip (semiconductor device), the measurement must be carried out while the probe of a current tester is brought into contact with a measurement target terminal provided to the IC chip. Therefore, the measurement is cumbersome, and it takes a long time to carry out the measurement.

SUMMARY

According to an aspect of an embodiment, a semiconductor device includes: a measurement target circuit including a first circuit, a switch provided to a measurement node of the first circuit and a second circuit connected to the measurement node of the first circuit through the switch; and a current measuring circuit including a reference current source group that is connected to the measurement node through the switch and makes a reference current of a predetermined value flow into the first circuit, a sample hold circuit that is connected to the measurement node, and samples and holds the potential of the measurement node when the first circuit is connected to the second circuit by the switch, and a comparator that is connected to the measurement node and an output of the sample hold circuit and compares an output of the sample hold circuit with the potential of the measurement node when the first circuit is connected to the reference current source group by the switch.

DESCRIPTION OF EMBODIMENTS

Aspects of embodiments of a semiconductor device will be described hereunder with reference to the accompanying drawings.

Figure 1:
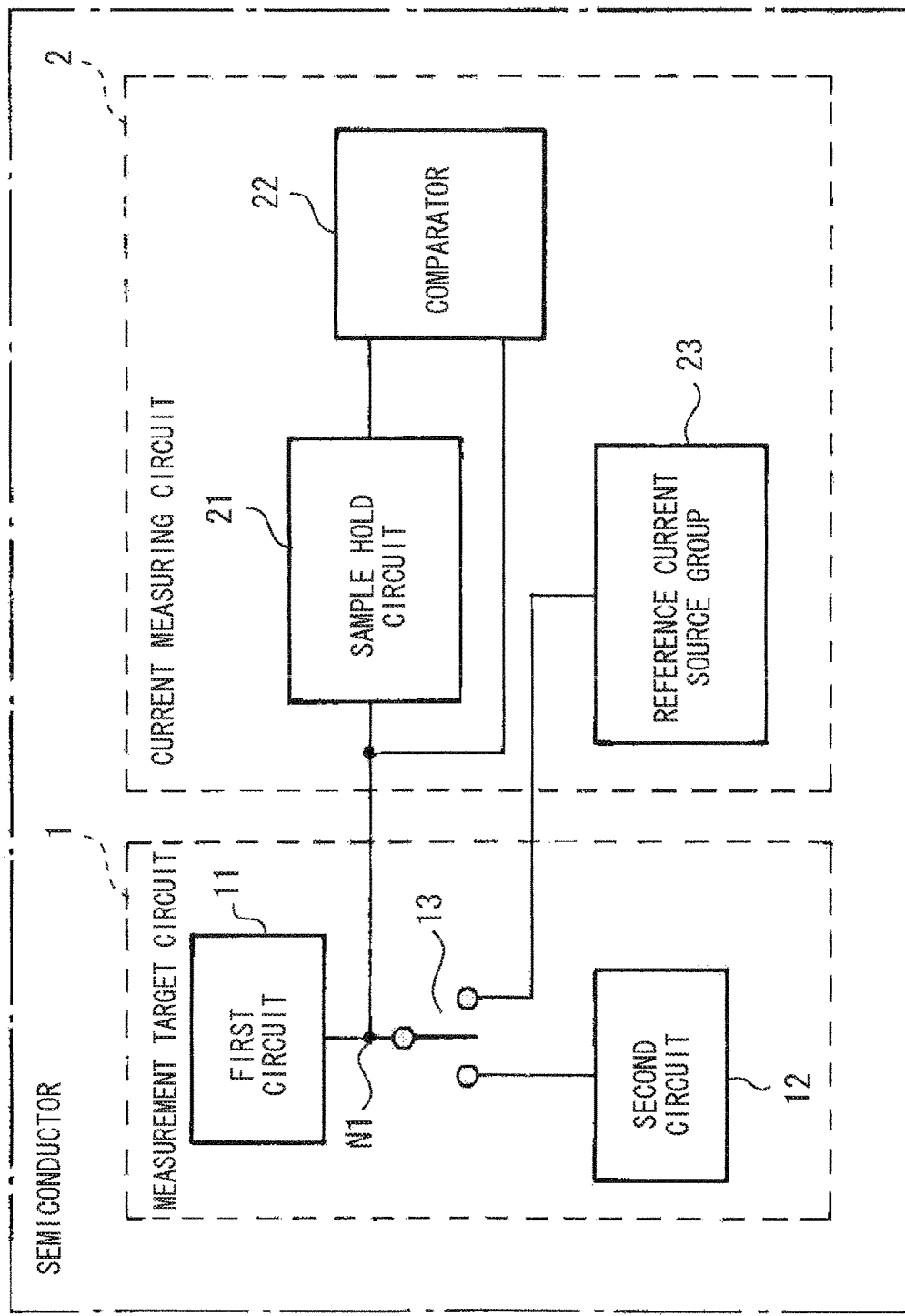
FIG. 1 is a block diagram schematically showing a semiconductor device according to a first embodiment.

FIG. 1 is a block diagram schematically showing a semiconductor device according to a first embodiment. In FIG. 1, reference numeral 1 represents a measurement target circuit, and reference numeral 2 represents a current measuring circuit.

As shown in FIG. 1, a measurement target circuit 1 comprises a first circuit 11, a switch 13 provided to a measurement node N1 of the first circuit 11, and a second circuit 12 connected to the measurement node N1 of the first circuit 11 through the switch 13. The current measurement circuit 2 has a sample hold circuit 21, a comparator 22 and a reference current source group 23.

The switch 13 divides the measurement target circuit 1 into the first circuit 11 and the second circuit 12, and the current flowing in the second circuit 12 is compared with current flowing in the reference current source group 23.

The switch 13 is provided at a proper place corresponding to the construction of the measurement target circuit 1.

The sample hold circuit 21 is connected to the measurement node N1. The sample hold circuit 21 samples and holds the potential of the measurement node N1 when the first circuit 11 is connected to the second circuit 12 by the switch 13.

The reference current source group 23 is connected to the measurement node N1 through the switch 13, and makes reference current having a predetermined value flow into the first circuit. Here, as described later, the reference current source group 23 makes reference current of predetermined plural values selectively flow into the first circuit 11.

The comparator 22 is connected to the outputs of the measurement node N1 and the sample hold circuit 21. The comparator 22 compares the output of the sample hold circuit 21 (the potential of the measurement node N1 when the first circuit 11 is connected to the second circuit 12 by the switch 13) with the potential of the measurement node N1 when the first circuit 11 is connected to the reference current source group 23 by the switch 13.

On the basis of the comparison result (variation of the output logic) of the comparator 22, the value of the reference current from the reference current source group 23 is determined, and it is recognized as the current flowing in the second circuit (the current flowing in the measurement target circuit 1).

As described above, according to the semiconductor device of the first embodiment, the current flowing through the circuit in the semiconductor device can be measured without using any external current tester by mounting the current measuring circuit on-chip.

Figure 2:
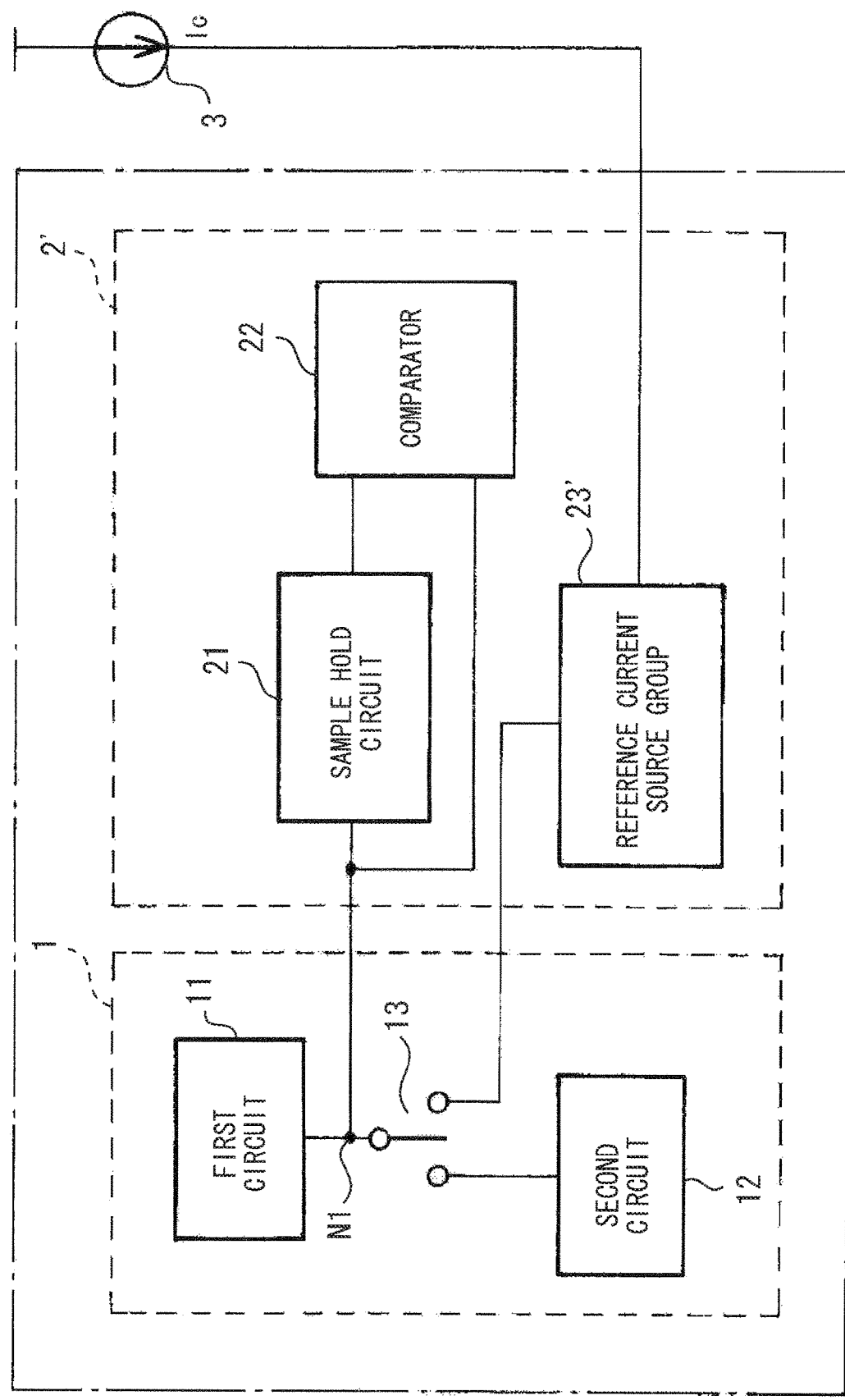
FIG. 2 is a block diagram schematically showing a semiconductor device according to a second embodiment.

FIG. 2 is a block diagram schematically showing a semiconductor device according to a second embodiment.

As is apparent from the comparison between FIG. 2 and FIG. 1, in the semiconductor device of the second embodiment, constant current Ic is supplied from an external current source 3 of the semiconductor device to a reference current source group 23. The reference current source group 23 selectively supplies the first circuit 11 with a plurality of reference current values generated on the basis of the constant current Ic.

As described above, according to the semiconductor device of the second embodiment, the constant current Ic is supplied from the outside of the semiconductor device. However, the plurality of reference current values can be generated on the basis of the constant current Ic, and thus an accurate current value can be made to flow into the first circuit 11. In this case, the current flowing through the circuit in the semiconductor device can be measured without using any current tester.

Figure 3:
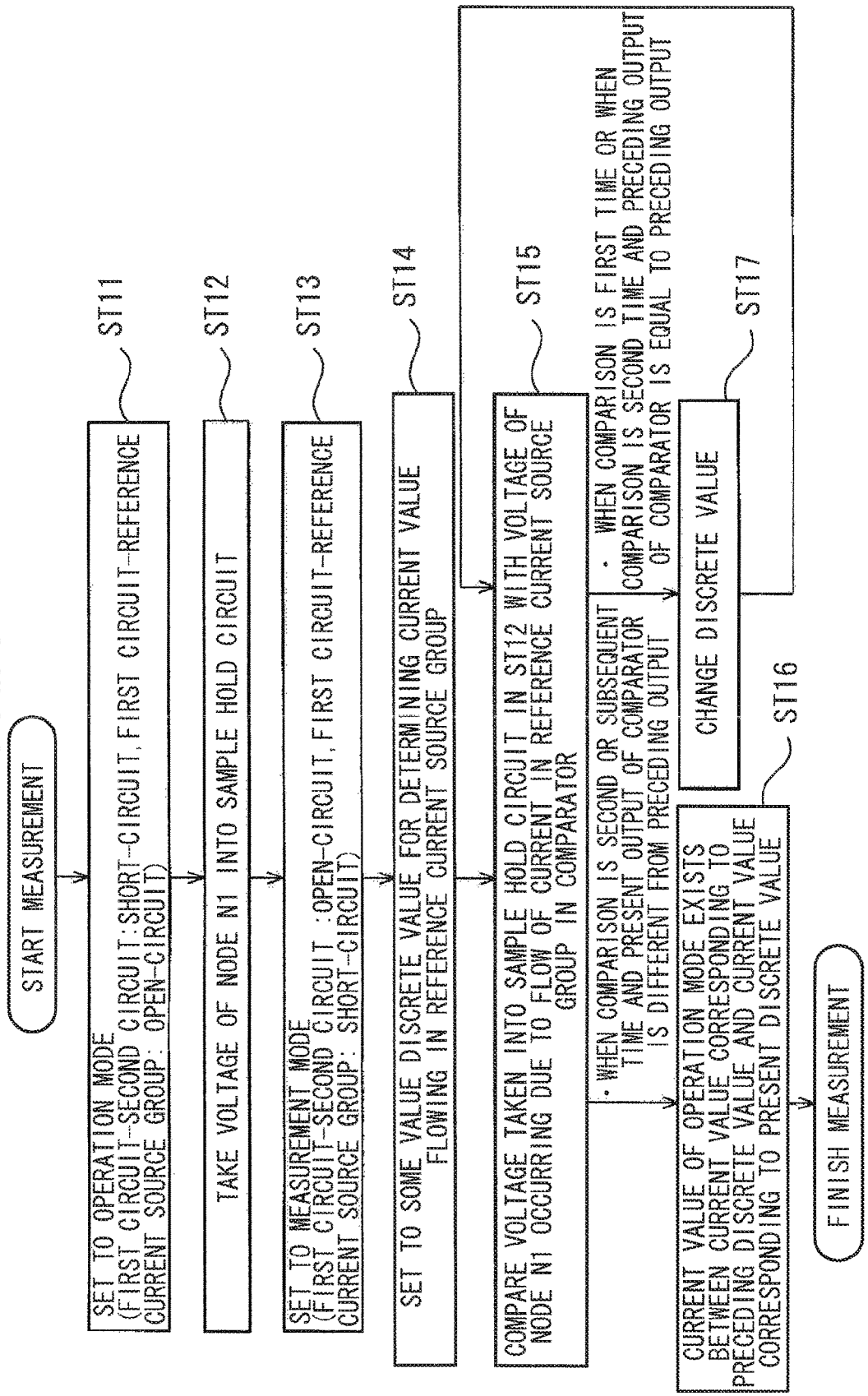
FIG. 3 is a flowchart showing an example of current measurement processing.

FIG. 3 is a flowchart showing an example of the current measurement processing.

As shown in FIG. 3, when the current measurement processing is started, the semiconductor device is set to an operation mode in step ST11. Specifically, for example, the first circuit 11 (the measurement node N1) and the second circuit 12 are short-circuited (connected) by the switch 13, and the first circuit 11 and the reference current source group 13 are open-circuit (disconnected) to each other.

Subsequently, in step ST12, the voltage of the node N1 is taken into the sample hold circuit 21. Subsequently, in step ST13, the semiconductor device is set to the measurement mode. Specifically, for example, the first circuit 11 and the second circuit 12 are open-circuit to each other, and the first circuit 11 and the reference current source group 23 are short-circuited to each other by the switch 13.

Subsequently, in step ST14, a discrete value for determining a current value flowing in the reference current source group 23 is set to some value. That is, the reference current is set to one of predetermined plural values.

Subsequently, the processing goes to step ST15 to compare the voltage taken into the sample hold circuit 21 in step ST12 (that is, the potential of the node N1 when the first circuit 11 is connected to the second circuit 12) with the voltage of the node N1 occurring due to flow of current in the reference current source group 23 (that is, the potential of the measurement node N1 when the first circuit 11 is connected to the reference current source group 23) in the comparator 22.

Subsequently, when the comparison is made a first time in the comparator 22 or when the comparison is made a second or subsequent time and the present output of the comparator 22 is the same as the preceding output, the discrete value flowing in the reference current source group 23 is changed in step ST17. That is, the value of the reference current flowing in the first circuit 11 is changed by the reference current source group 23, and then the processing goes to step ST15.

When the comparison in the comparator 22 is made a second or subsequent time and the present output of the comparator 22 is different from the preceding output, that is, when the output logic of the comparator 22 varies, the processing goes to step ST16.

In step ST16, a current value of the operation mode exists between the current value corresponding to the preceding discrete value and the present discrete value. That is, the current flowing in the measurement target circuit 1 is recognized by defining the value of the reference current flowing in the first circuit 11. Then, the current measurement processing is finished.

Figure 4:
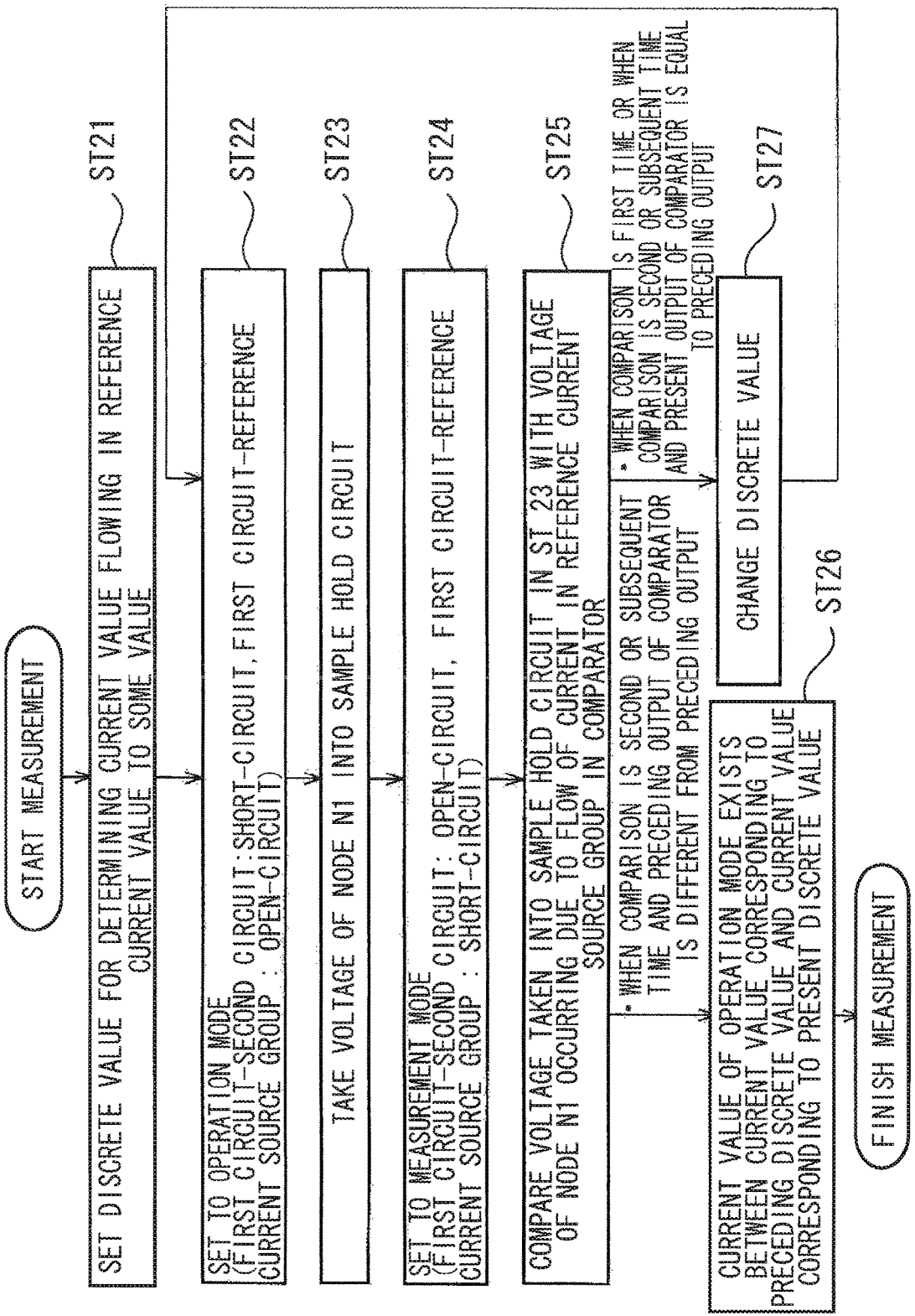
FIG. 4 is a flowchart showing another example of the current measurement processing.

FIG. 4 is a flowchart showing another example of the current measurement processing, this example is effective in a situation where voltage variation due to a leak of the sample hold circuit 21 is required to be suppressed.

As shown in FIG. 4, when the current measurement processing is started, in step ST21, the discrete value for determining the current value flowing in the reference current source group 23 is set to a value, that is, the reference current is set to one of a plurality of predetermined values.

Subsequently, in step ST22, the semiconductor device is set to the operation mode. Specifically, for example, the first circuit 11 (the measurement node N1) and the second circuit 12 are short-circuited (connected) to each other by the switch 13, and the first circuit 11 and the reference current source group 23 are open-circuit (disconnected) to each other.

Subsequently, in step ST23, the voltage of the node N1 is taken into the sample hold circuit 21, and then in step ST24 the semiconductor device is set to the measurement mode. Specifically, for example, the first circuit 11 and the second circuit 12 are open-circuit to each other by the switch 13, and the first circuit 11 and the reference current source group 23 are short-circuited to each other by the switch 13.

Furthermore, the processing goes to step ST25, and the voltage taken into the sample hold circuit 21 in step ST23 (that is, the potential of the measurement node N1 when the first circuit 11 is connected to the second circuit 12) is compared with the voltage of the measurement node N1 occurring due to flow of current into the reference current source group 23 (that is, the potential of the measurement node N1 when the first circuit 11 is connected to the reference current source group 23) in the comparator 22.

Subsequently, when the comparison of the comparator 22 is made the first time or when the comparison of the comparator 22 is made the second or subsequent time and the present output of the comparator 22 is the same as the preceding output, the discrete value flowing in the reference current source group 23 is changed in step ST27. That is, the value of the reference current flowing in the first circuit 11 is changed by the reference current source group 23, and then the processing returns to step ST22.

Here, in the current measurement processing shown in FIG. 4, the discrete value flowing in the reference current source group 23 is changed in step ST27, and then the processing returns to step ST22 to set the semiconductor device to the operation mode. Thereafter, in step ST23, the voltage of the node N1 is taken into the sample hold circuit 21. As described above, the voltage of the node N1 is taken into the sample hold circuit 21 every time the discrete value flowing in the reference current source group 23 is changed, whereby the voltage variation caused by the leak of the sample hold circuit 21 can be suppressed.

When the comparison of the comparator 22 is made the second or subsequent time and the present output of the comparator 22 is different from the preceding output, that is, when the output logic of the comparator 22 varies, the processing goes to step ST26.

In step ST26, a current value of the operation mode exists between the current value corresponding to the preceding discrete value and the current value corresponding to the present discrete value. That is, the current flowing in the measurement target circuit 1 is recognized by defining the value of the reference current flowing in the first circuit 11 by the reference current source group 23.

Figure 5:
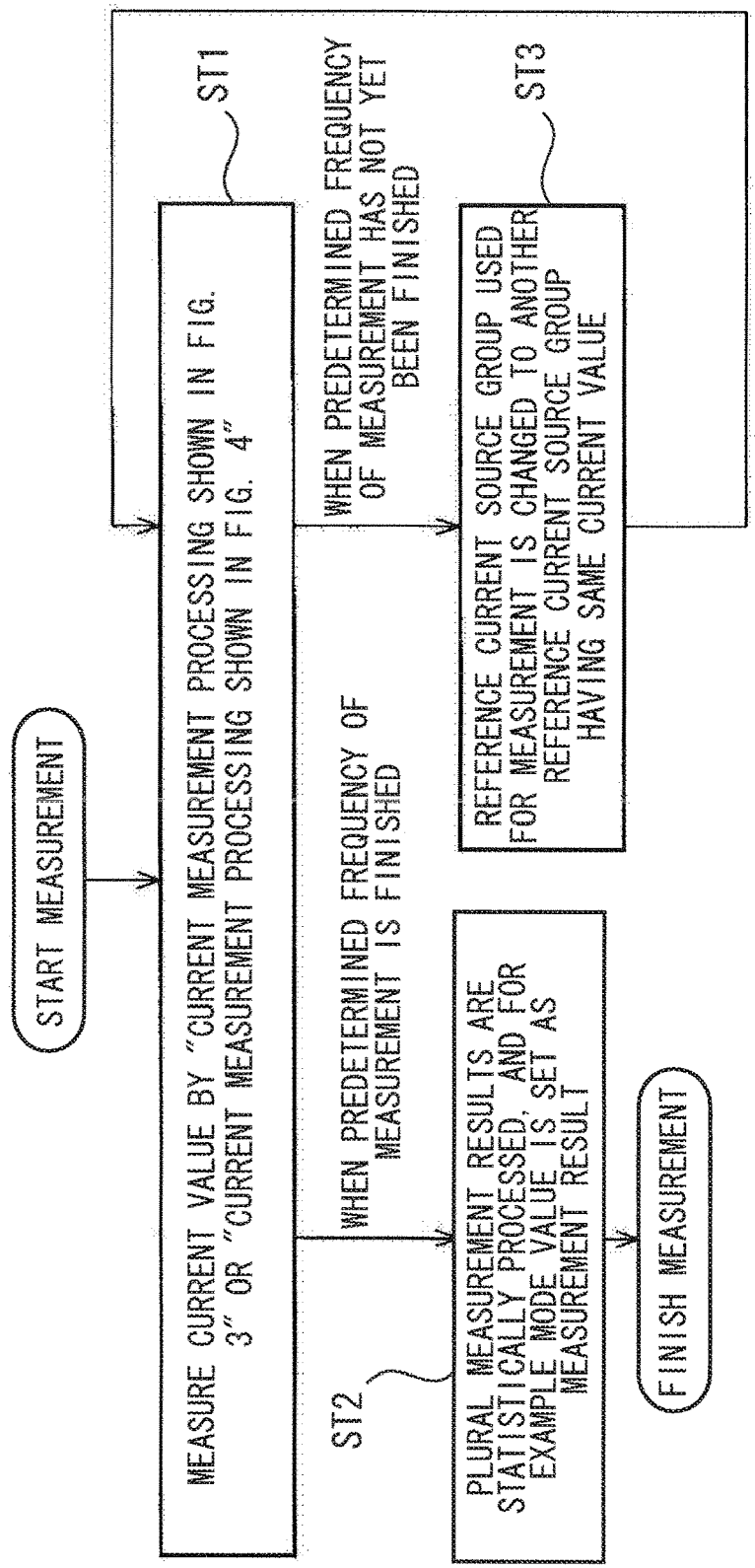
FIG. 5 is a flowchart showing a further example of the current measurement processing.

FIG. 5 is a flowchart showing another example of the current measurement processing.

As shown in FIG. 5, when the current measurement processing is started, in step ST1, the current measurement processing shown in FIG. 3 or the current measurement processing shown in FIG. 4 is executed to measure the current value of the measurement target circuit 1.

Subsequently, when the measurement has not yet been carried out at a predetermined frequency, in step ST3, the reference current source used for the measurement is changed to a reference current source which has the same current value, but is different from the reference current source which has been already used. That is, the reference current source 21 is redundantly provided with constructions of generating the same value as the reference current, whereby the measurement is carried out a plurality of times on the basis of the same value as the reference current generated by the different constructions.

When the measurements of the predetermined frequency are finished, in step ST2, the plural measurement results are statistically processed, and the mode value thereof is set as the measurement result.

Accordingly, any measurement error caused by the reference current generated by the reference current source group is compensated to enhance measurement precision.

Figure 6:
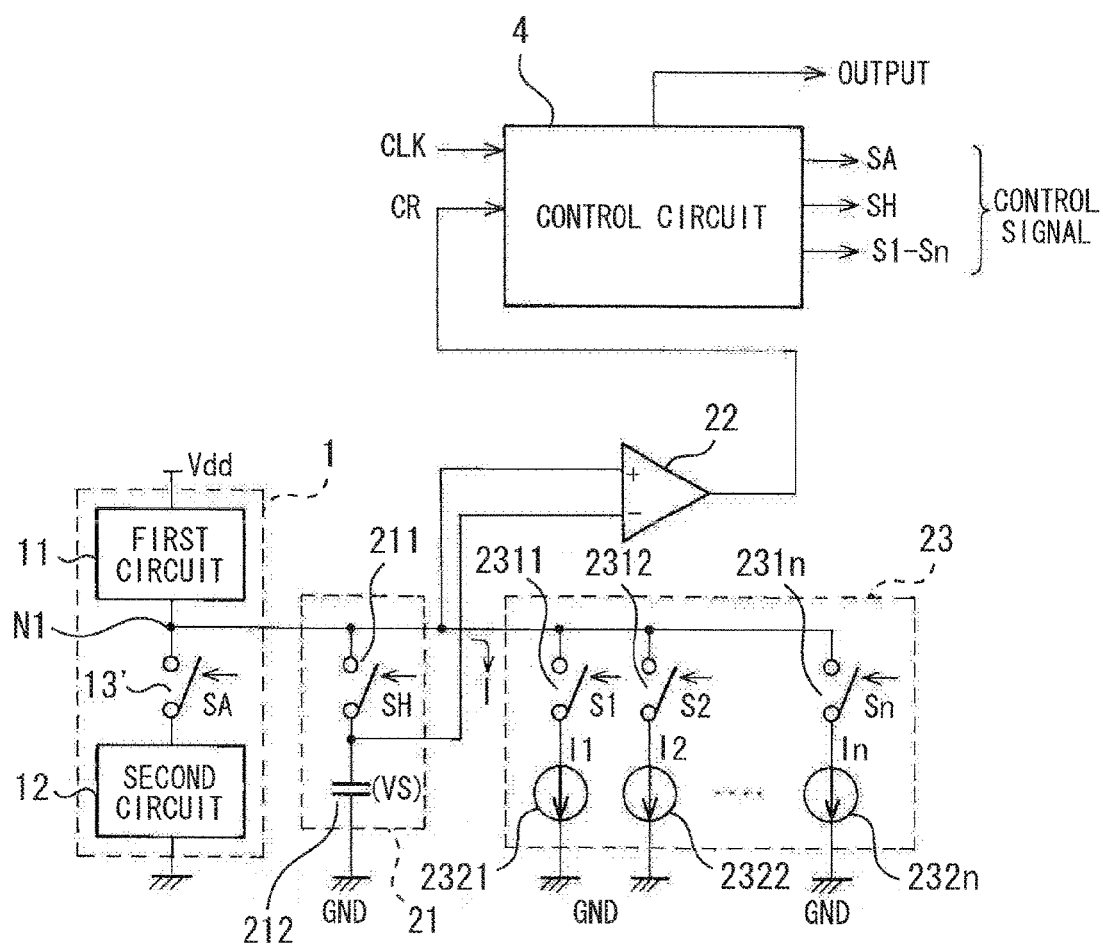
FIG. 6 is a circuit diagram showing an example of the semiconductor device.

FIG. 6 is a circuit diagram showing an embodiment of the semiconductor device. In FIG. 6, reference numeral 4 represents a control circuit. The control circuit 4 receives a clock signal CLK and an output signal (comparison result) of the comparator 22, and outputs control signals SA, SH and S1 to Sn to the respective switches. Furthermore, the control circuit 4 outputs to the outside of the semiconductor device an output representing the association between the ON/OFF state of a current source switch described later and the comparison result of the comparator 22 at that time.

Figure 7:
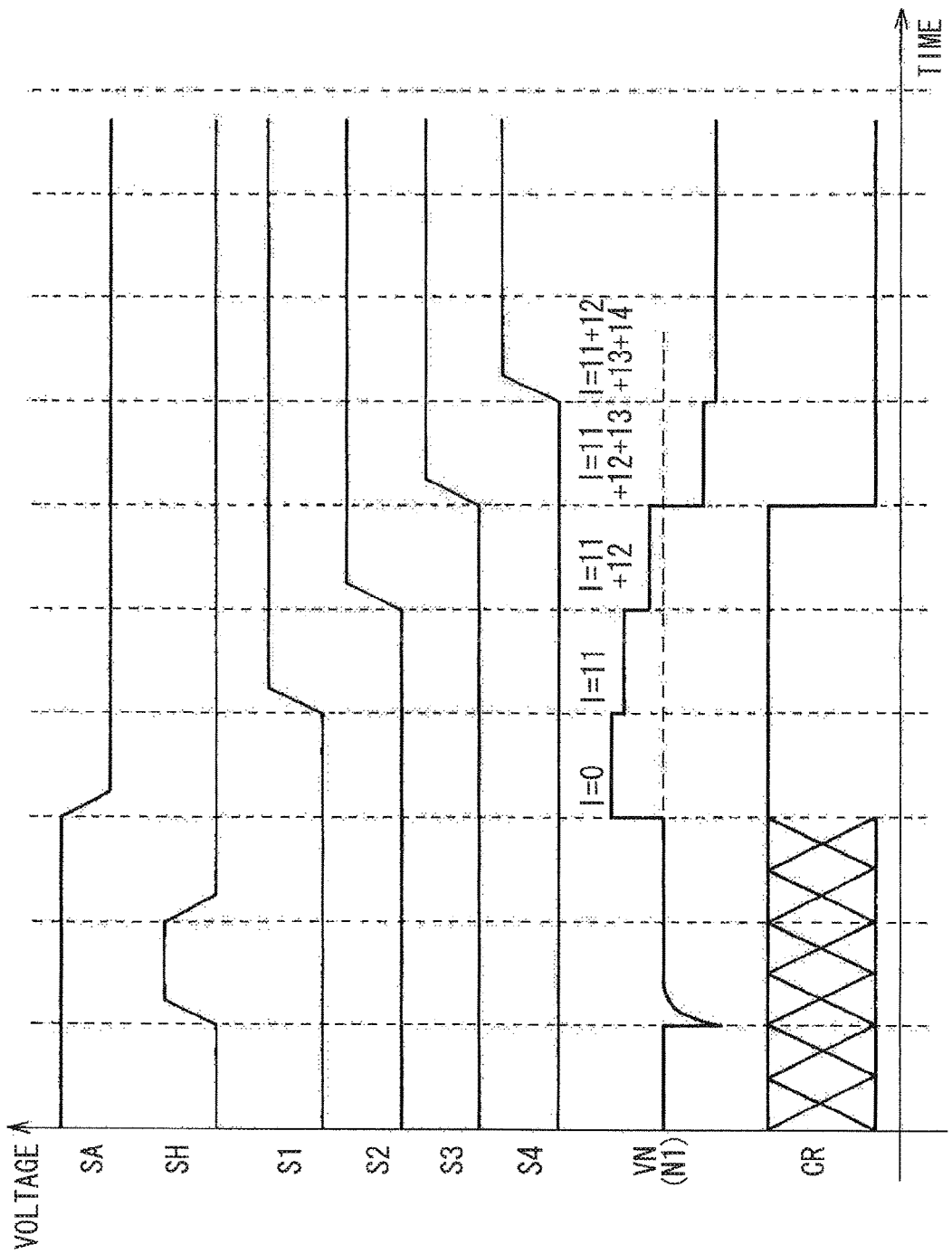
FIG. 7 is a waveform diagram showing the operation of the semiconductor device of FIG. 6.

FIG. 7 is a waveform diagram showing the operation of the semiconductor device of FIG. 6. FIG. 7 shows the variation of high level "H" to low level "L" of the output (comparison result CR) of the comparator 22 in a case where the state that three current sources 2321 to 2323 contained in the reference current source group 23 are turned on (I=I1+I2+I3) to the state that four current sources 2321 to 2324 are turned on (I=I1+I2+I3+I4).

As shown in FIG. 6, the control circuit 4 outputs a signal SA for controlling ON/OFF of a switch 13' of the measurement target circuit 1, a signal SH for controlling ON/OFF of a sampling switch 211 of the sample hold circuit 21, and signals S1 to Sn for controlling ON/OFF of current source switches 2311 to 231$n$ connected to plural current sources 2321 to 232$n$ of the reference current source group 23.

As shown in FIGS. 6 and 7, the control signal SA is first set to the high level "H" and the switch 13' is turned on, whereby the semiconductor device is set to the operation mode. In the operation mode, the control signals SH and S1 to Sn (S4 in FIG. 7) are set to the low level "L", whereby the sampling switch 211 and the current source switches 2311 to 231$n$ (2314) are set to OFF.

Subsequently, by setting the control signal SH to the high level "H" for only one clock, the sampling switch 211 is varied to be turned off, turned on and then turned off, and the voltage VS of the node N1 is sampled and held in a capacitor 212.

Furthermore, the control signal SA is varied from the high level "H" to the lower level "L" to turn off the switch 13', whereby the semiconductor device is switched from the operation mode to the measurement mode.

In the reference current source group 23, the control signal S1 is varied from the low level "L" to the high level "H" to turn on the switch 2311, whereby the current I1 of the current source 2321 is set to current I flowing in the reference current source 23.

The output voltage of the sample hold circuit 21 (the voltage VS held in the capacitor 212) and the voltage VN of the node N1 at that time are compared with each other by the comparator 22, and the comparison result CR of the comparator 22 is output to and recorded in the control circuit 4. At this time, the voltage VN of the node N1 is represented by Vdd−R1×I1 (that is, VN=Vdd−R1×I1) when R1 represents the impedance of the first circuit 11.

Subsequently, the control signal S2 is changed from the low level "L" to the high level "H" to set the switch 2312 to ON, whereby the current I1+I2 of the current sources 2321 and 2322 is set as the current flowing in the reference current source group 23. The output voltage VS of the sample hold circuit 21 and the voltage VN of the node N1 at that time are compared with each other by the comparator 22, and the comparison result CR of the comparator 22 is output to and recorded in the control circuit 4. At this time, the voltage VN of the node N1 is equal to Vdd−R1×(I1+I2) (that is, VN=Vdd−R1×(I1+I2)).

Likewise, the ON-setting of the current source switches 2311 to 231$n$ on the basis of the control signals S1 to Sn is successively varied until the comparison result CR of the comparator 22 varies (the output logic is inverted), and it is recorded in the control circuit 4 together with the comparison result CR of the comparator 22. The variation of the ON-setting of the current source switches 2311 to 231$n$ on the basis of the control signals S1 to Sn is carried out on the basis of the clock signal CLK.

Accordingly, the ON/OFF state of the current source switches 2311 to 231$n$ on the basis of the control signals S1 to Sn and the output logic (CR) of the comparator 22 at that time are recorded in the control circuit 4. The current I flowing in the reference current source group 23 is determined on the basis of the ON/OFF state of the current source switches 2311 to 231$n$ when the output logic (CR) of the comparator 22 is inverted. The current I flowing in the reference current source group 23 is defined as the current flowing in the measurement target circuit 1.

Specifically, in the example of FIG. 7, the comparison result CR of the comparator 22 is inverted from the high level "H" to the low level "L" between the current I (=I1+I2) when the switches 2311 and 2312 are set to ON on the basis of the control signals S1 to S4 and the current I (=I1+I2+I3) when the switches 2311 to 2313 are set to ON on the basis of the control signals S1 to S4.

Accordingly, the magnitude of the current flowing in the first circuit 11 (the measurement target circuit 1) is defined as a value between the I1+I2 and I1+I2+I3 (for example, {(I1+I2)+(I1+I2+I3)}/2).

Accordingly, the currents I1 to In flowing in the plural current sources 2321 to 232n in the reference current source group 23 may be set to the same current value (may be set to current values having the arithmetic series relation: for example, 100 μA, 200 μA, 300 μA, 400 μA, ... ), however, set to current values having the power-series relation (for example, 100 μA, 200 μA, 400 μA, 800 μA, ... ).

The control circuit 4 outputs the current flowing in the reference current source group 23 (the current flowing in the measurement target circuit 1) to the outside of the semiconductor device by outputting the state (logic) of the control signals S1 to Sn when the output logic of the comparator 22 is inverted. Accordingly, the current flowing in the measurement target circuit 1 can be recognized at the outside of the semiconductor device by a general logic tester without using any current tester for directly measuring current.

The setting of the values of the respective current sources 2321 to 232n, the control of the current source switches 2311 to 231n and the take-out of the output of the set data of the current source switch and the output of the comparator 22 to the outside of the semiconductor device are not limited to those described above, and various well-known methods may be applied.

Figure 8:
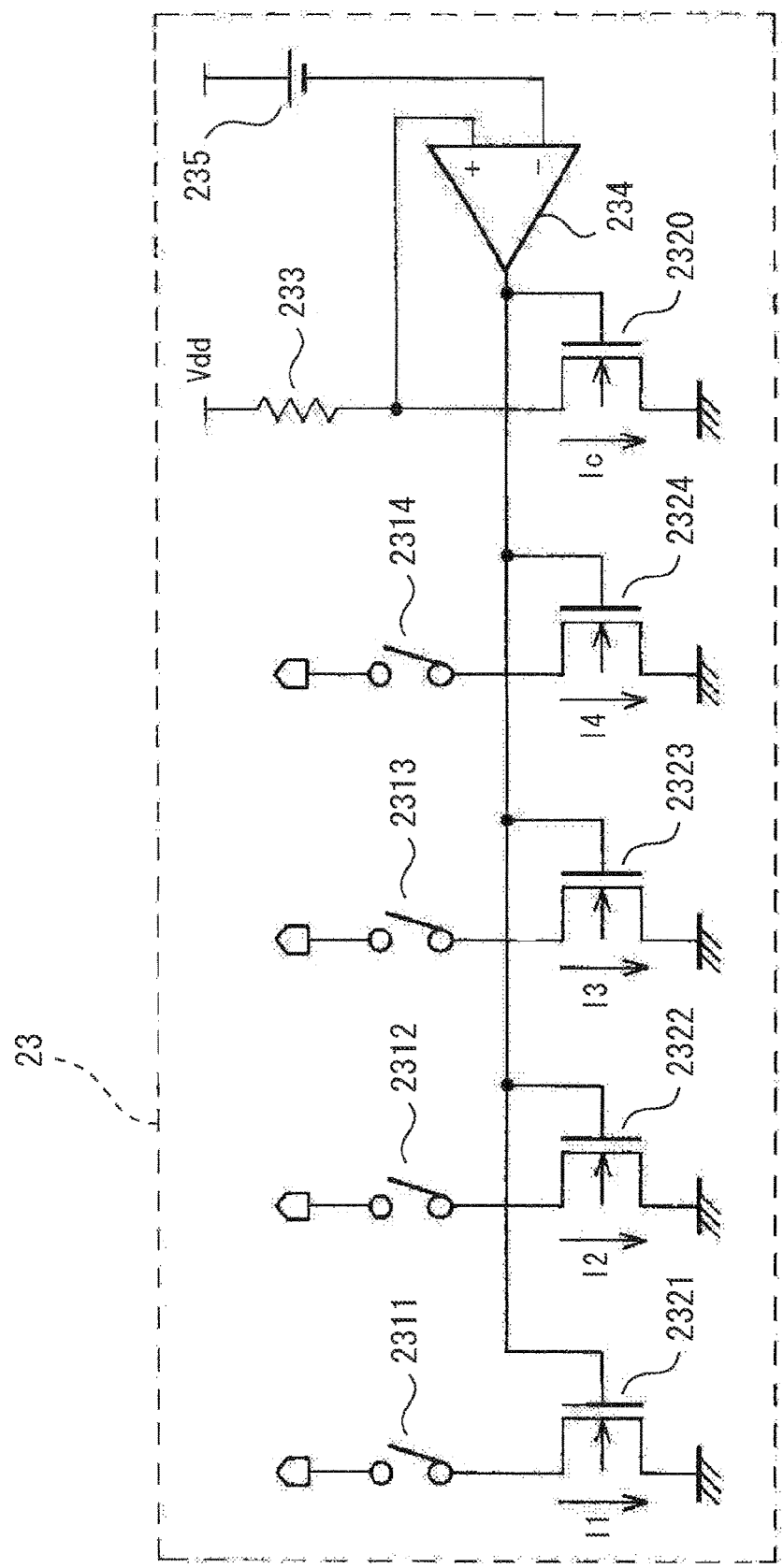
FIG. 8 is a circuit diagram showing an example of a reference current source in the semiconductor device of the first embodiment.

FIG. 8 is a circuit diagram showing an example of the reference current source in the semiconductor device of the first embodiment. FIG. 8 shows a construction having a reference voltage generating circuit for generating a reference current in the semiconductor device.

As shown in FIG. 8, the reference voltage generating circuit has a load resistor 233 connected to a high potential power source line (Vdd) and an operational amplifier 234 connected to a power source 235, and it compares a voltage dropped by the load resistor 233 with the voltage of the power source 235 and outputs a constant voltage Vc to the gate of a constant-current transistor 2320. The power source 235 is, for example, a band-gap reference circuit.

The source of the constant-current transistor 2320 is connected to the ground (GND). The drain of the constant-current transistor 2320 is connected to a high potential power supply line (Vdd) through the load resistor 233. The output voltage of the operational amplifier 234 is applied to the gate of the constant-current transistor 2320 together with the gates of plural current source transistors 2321 to 2324.

That is, the current source transistors 2321 to 2324 are current-mirror-connected to the constant-current transistor 2320, so that currents I1 to I4 corresponding to the gate width of the constant-current transistor 2320 flow in the current source transistors 2321 to 2324. Here, the currents I1 to I4 flowing in the current source transistors 2321 to 2324 may be set to the same current value by setting the gate widths of the respective transistors to the same value (arithmetically varied), however, the currents I1 to I4 may be set to power-series current values by varying the gate widths of the respective transistors in power-series.

Figure 9:
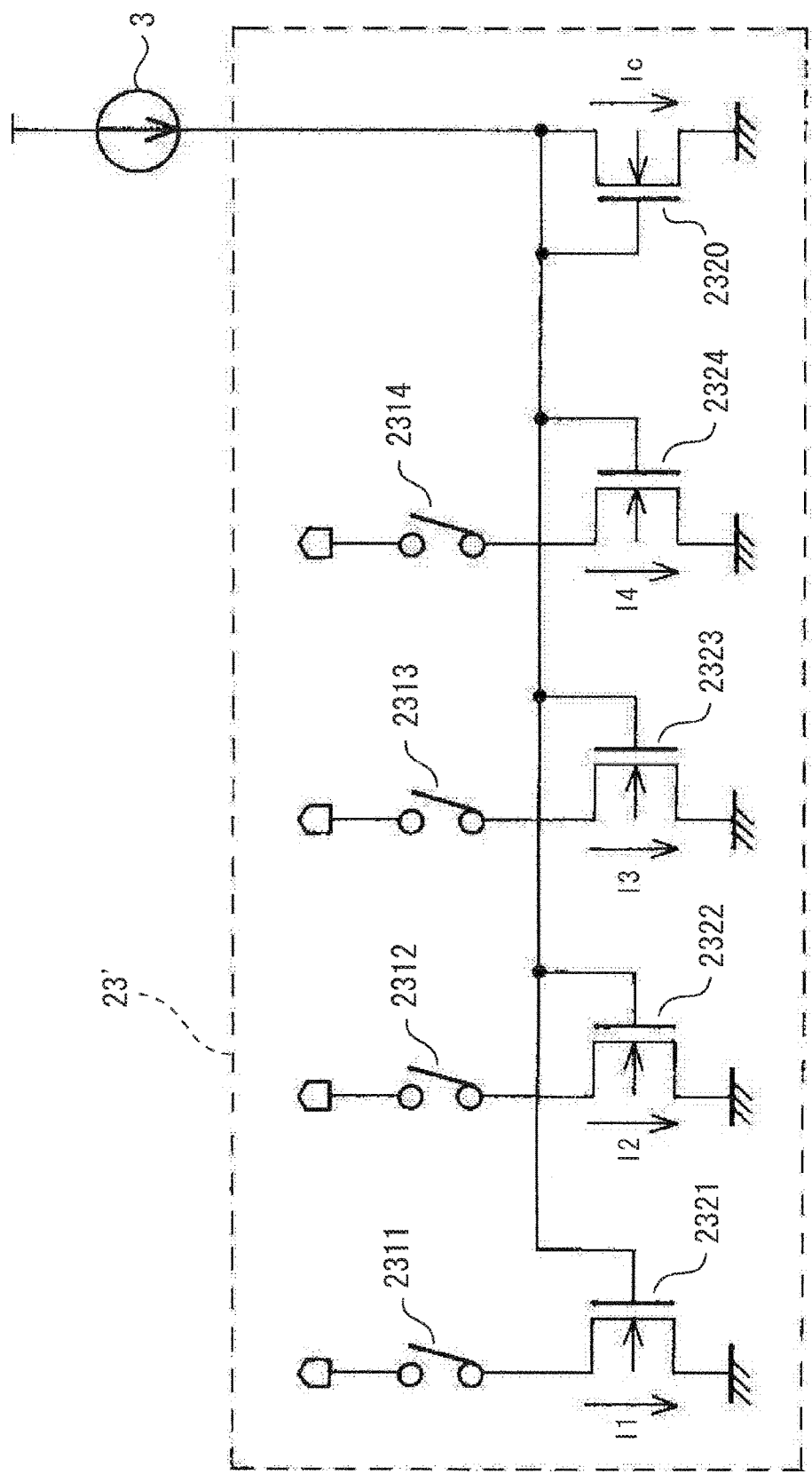
FIG. 9 is a circuit diagram showing another example of the reference current source in the semiconductor device of the second embodiment.

FIG. 9 is a circuit diagram showing another example of the reference current source in the semiconductor device according to a second embodiment, and shows a construction for supplying current from the external of the semiconductor device to the reference current source group.

As shown in FIG. 9, in the second embodiment, no reference voltage generating circuit is provided to the semiconductor device. Current Ic is made to directly flow from the current source 3 at the outside of the semiconductor device into the constant-current transistor 2320 of the reference current source group 231. That is, current Ic whose current value is known is made to flow in the constant-current transistor 2320, whereby the currents I1 to I4 flowing in the plural current source transistors 2321 to 2324 which are current-mirror-connected to the constant-current transistor 2320 can be accurately set.

In FIG. 8 and FIG. 9, the number of the current source transistors 2321 to 2324 controlled by the current source switches 2311 to 2314 is equal to four, however, the actual reference current source group 23 (23') is constructed by many current source switches 2311 to 231n and current source transistors 2321 to 232n.

Figure 10:
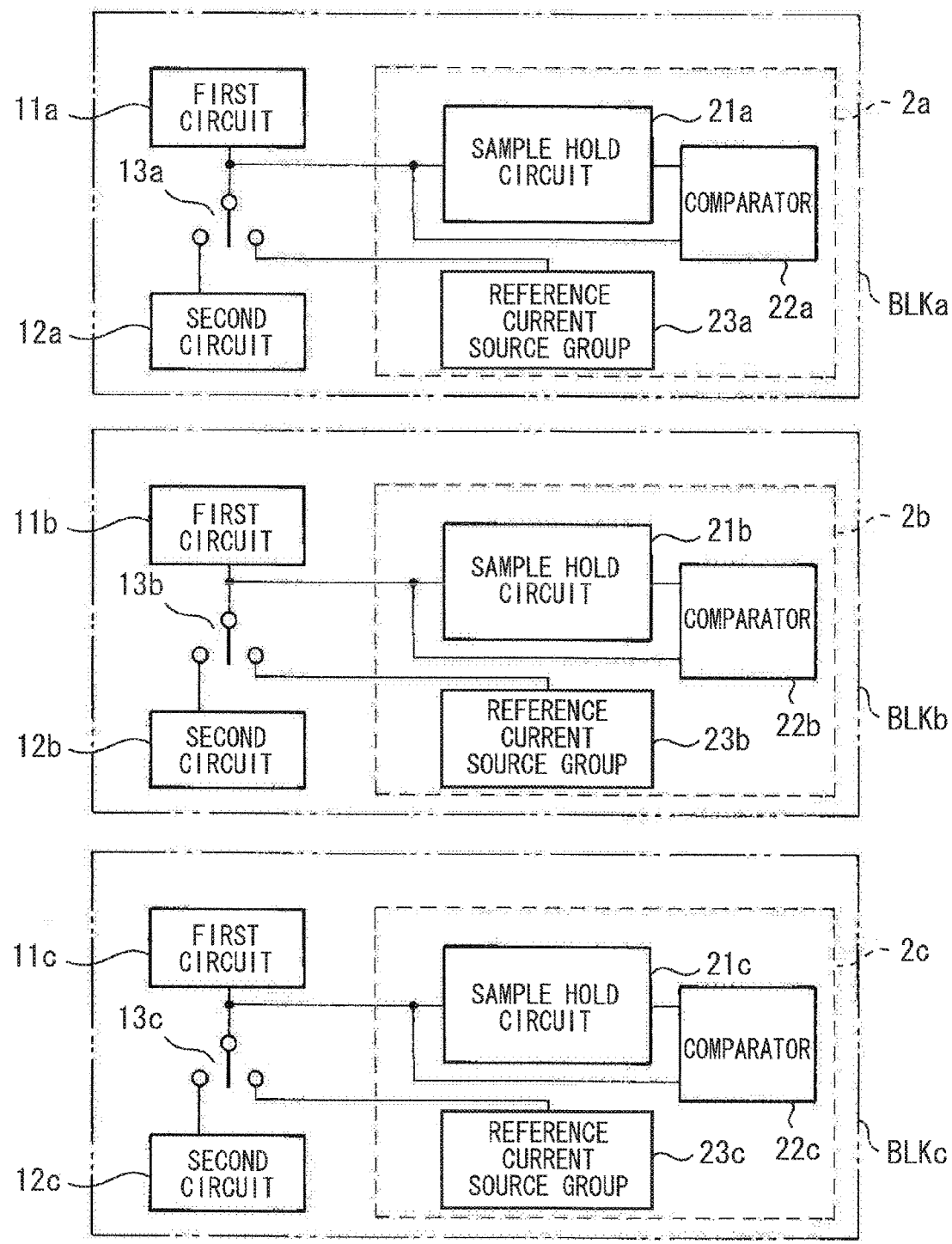
FIG. 10 is a block diagram showing an example of the construction of a measurement target circuit and a current measuring circuit in the semiconductor device.

FIG. 10 is a block diagram showing an exemplary construction of the measurement target circuit and the current measuring circuit in the semiconductor device. FIG. 10 shows the construction that current measuring circuits 2a to 2c are provided for respective circuit blocks (each macro) BLKa to BLKc.

That is, in the embodiment shown in FIG. 10, dedicated current measuring circuits 2a to 2c can perform proper current detection on the respective macros BLKa to BLKc. Accordingly, the current of the measurement target circuit of each of the macros BLKa to BLKc can be measured and checked from the external of the semiconductor chip.

The construction of the first circuits 11a to 11c, the second circuits 12a to 12c, the switches 13a to 13c, the sample hold circuits 21a to 21c, the comparators 22a to 22c and the reference current source groups 23a to 23c in the respective macros BLKa to BLKc are the same as the first circuit 11, the second circuit 12, the switch 13, the sample hold circuit 21, the comparator 22 and the reference current source group 23, respectively.

Figure 11:
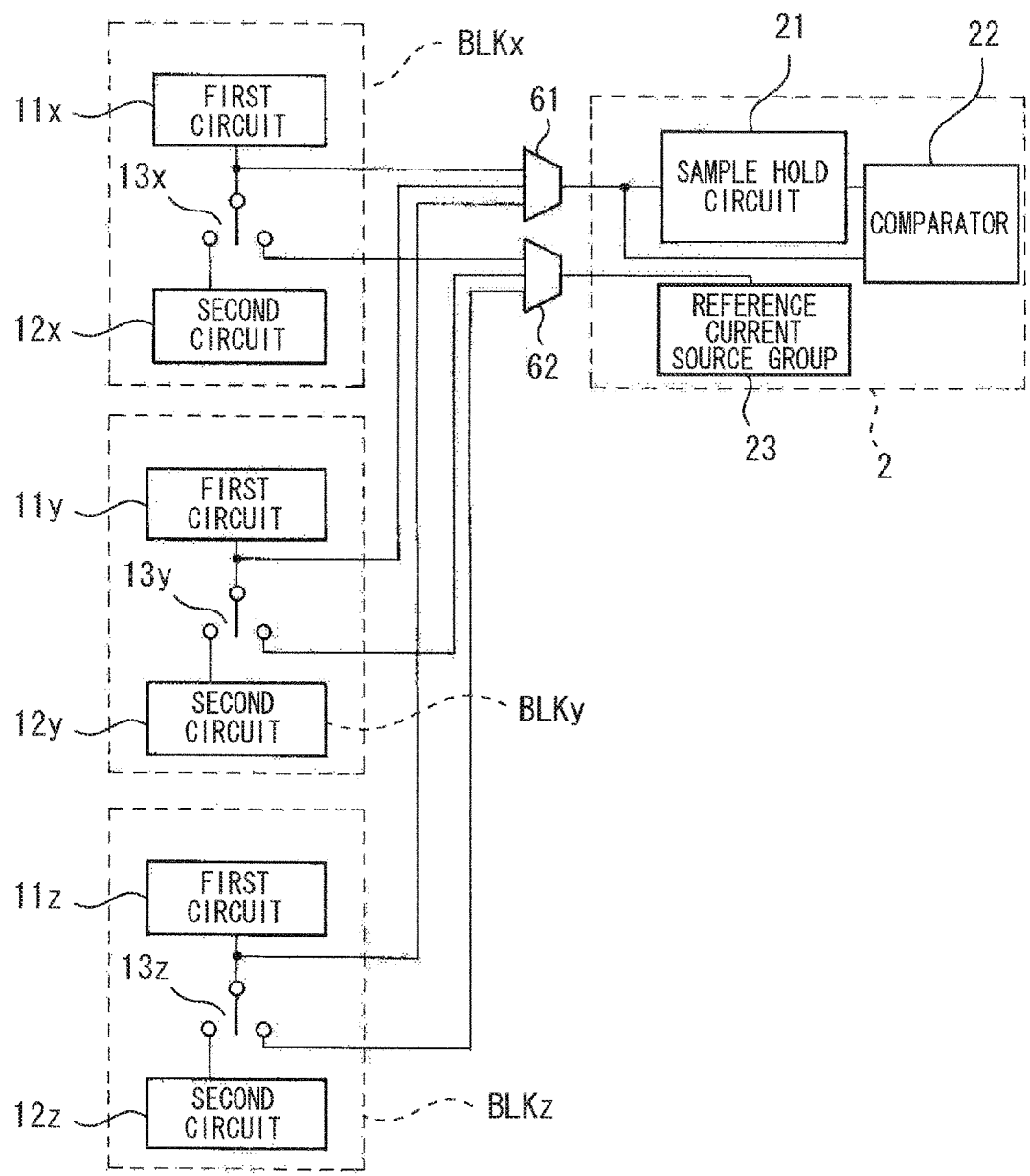
FIG. 11 is a block diagram showing another example of the construction of the measurement target circuit and the current measuring circuit in the semiconductor device.

FIG. 11 is a block diagram showing another example of the construction of the measurement target circuit and the current measurement circuit in the semiconductor device. FIG. 11 shows the construction that a common current measuring circuit 2 is provided to plural circuit blocks BLKx to BLKz.

That is, in the embodiment shown in FIG. 11, one common current measuring circuit 2 is provided to three circuit blocks BLKx to BLKz. Any one of the circuit blocks BLKx to BLKz to be measured is successively selected by selectors 61 and 62, and the current measurement is carried out by the common current measuring circuit 2.

At this time, with respect to the current measurement of the plural circuit blocks BLKx to BLKz by the common current measuring circuit 2, the measurement range and the resolution based on the reference current source group 23 in the current measuring circuit 2 are common, and thus it is preferable to carry out the measurement on a circuit block which satisfies the measurement range and the resolution. Accordingly, for example, when it is estimated that the values of the currents flowing in the plural circuit blocks of the measurement target circuits are greatly different from one another, a dedicated current measuring circuit is provided to each circuit block as in the case of the embodiment shown in FIG. 10.

As described above, the measured current flowing through the circuit in the semiconductor device (IC chip) is used to check the defect of the circuits in a manufactured IC chip before the IC chip is shipped, or to specify a defective circuit in an IC chip under malfunction.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A semiconductor device comprising:
   a measurement target circuit including a first circuit, a switch provided to a measurement node of the first circuit and a second circuit connected to the measurement node of the first circuit through the switch; and
   a current measuring circuit including a reference current source group that is connected to the measurement node through the switch and makes a reference current of a predetermined value flow into the first circuit, a sample hold circuit that is connected to the measurement node, and samples and holds the potential of the measurement node when the first circuit is connected to the second circuit by the switch, and a comparator that is connected to the measurement node and an output of the sample hold circuit and compares an output of the sample hold circuit with the potential of the measurement node when the first circuit is connected to the reference current source group by the switch.

2. The semiconductor device according to claim 1, wherein the reference current source group makes a reference current of any one of predetermined plural values flow into the first circuit and defines the value of the reference current on the basis of variation of the output logic of the comparator.

3. The semiconductor device according to claim 2, wherein the reference current source group comprises:
   a first transistor through which a constant current flows on the basis of the reference voltage generated in the semiconductor device;
   plural current source transistors that are current-mirror-connected to the first transistor; and
   plural current source switches for controlling the connection of the plural current source transistors so that the reference current of any one of the predetermined plural values flows in the first circuit.

4. The semiconductor device according to claim 3, wherein the reference current source group includes a reference voltage generating circuit for generating a reference voltage in the semiconductor device, and the current value to flow into the first transistor is defined by using the reference voltage generated by the reference voltage generating circuit.

5. The semiconductor device according to claim 3, wherein current supplied from the external of the semiconductor device is made to flow in the first transistor, thereby defining the current value flowing in the first transistor.

6. The semiconductor device according to claim 3, wherein the plural current source transistors are transistors having the same gate width as the first transistors, and any one of the plural values of the reference current with which the output logic of the comparator is varied is defined by successively switching the plural current source switches.

7. The semiconductor device according to claim 3, wherein the plural current source transistors are transistors whose gate widths are in power-series relation to the gate width of the first transistor, and any one of the plural values of the reference current with which the output logic of the comparator is varied is defined by successively switching the plural current source switches.

8. The semiconductor device according to claim 1, wherein a plurality of measurement target circuits are provided in the semiconductor device, and the current measuring circuit is provided to each of the plural measurement target circuits.

9. The semiconductor device according to claim 1, wherein a plurality of measurement target circuits are provided in the semiconductor device, the current measuring circuit is provided commonly to the plural measurement target circuits, and the semiconductor device is equipped with a selector for selectively connecting any one of the plural measurement target circuits to the current measuring circuit.

* * * * *